(12) United States Patent
Bertness et al.

(10) Patent No.: US 8,306,690 B2
(45) Date of Patent: Nov. 6, 2012

(54) BATTERY TESTER FOR ELECTRIC VEHICLE

(75) Inventors: Kevin I. Bertness, Batavia, IL (US); Stephen J. McShane, Oak Brook, IL (US)

(73) Assignee: Midtronics, Inc., Willowbrook, IL (US)

( * ) Notice: Subject to any disclaimer, the term of this patent is extended or adjusted under 35 U.S.C. 154(b) by 872 days.

(21) Appl. No.: 12/174,894

(22) Filed: Jul. 17, 2008

(65) Prior Publication Data

US 2009/0024266 A1     Jan. 22, 2009

Related U.S. Application Data

(60) Provisional application No. 60/950,182, filed on Jul. 17, 2007, provisional application No. 60/970,319, filed on Sep. 6, 2007.

(51) Int. Cl.
*G06F 11/30*     (2006.01)
(52) U.S. Cl. ....... 701/34.4; 701/22; 701/29.1; 701/32.8; 701/33.6; 701/34.2; 702/57; 702/58; 702/64
(58) Field of Classification Search .......................... None
See application file for complete search history.

(56) References Cited

U.S. PATENT DOCUMENTS

| | | | |
|---|---|---|---|
| 85,553 A | 1/1869 | Adams | 33/472 |
| 2,000,665 A | 5/1935 | Neal | 439/440 |
| 2,417,940 A | 3/1947 | Lehman | 200/61.25 |
| 2,514,745 A | 7/1950 | Dalzell | 324/115 |
| 2,727,221 A | 12/1955 | Springg | 340/447 |
| 3,178,686 A | 4/1965 | Mills | 340/447 |
| 3,223,969 A | 12/1965 | Alexander | 340/447 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |

(Continued)

FOREIGN PATENT DOCUMENTS

DE      29 26 716 B1     1/1981

(Continued)

OTHER PUBLICATIONS

"A Microprocessor-Based Control System for a Near-Term Electric Vehicle", Bimal K. Bose; IEEE Transactions on Industry Applications, vol. IA-17, No. 6, Nov./Dec. 198?,; 0093-9994/81/1100-0626$00.75 © 1981 IEEE, 6 pages.

(Continued)

*Primary Examiner* — Khoi Tran
*Assistant Examiner* — Jonathan L Sample
(74) *Attorney, Agent, or Firm* — Westman, Champlin & Kelly, P.A.

(57) ABSTRACT

Testing or diagnostics are performed on an electric vehicle. The vehicle is operated and current flow through a system of the vehicle is monitored. A voltage related to the system is also monitored. Diagnostics are provided based upon the monitored voltage and the monitored current.

42 Claims, 4 Drawing Sheets

U.S. PATENT DOCUMENTS

| | | | |
|---|---|---|---|
| 3,808,522 A | 4/1974 | Sharaf | 324/430 |
| 3,811,089 A | 5/1974 | Strzelewicz | 324/170 |
| 3,816,805 A | 6/1974 | Terry | 320/123 |
| 3,850,490 A | 11/1974 | Zehr | 439/822 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koenck | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,382 A * | 2/1993 | Kondo | 307/10.1 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |

| | | | | | | | |
|---|---|---|---|---|---|---|---|
| 5,323,337 A | 6/1994 | Wilson et al. ................... 702/73 | | 5,675,234 A | 10/1997 | Greene ................... 340/636.11 |
| 5,325,041 A | 6/1994 | Briggs ........................ 320/149 | | 5,677,077 A | 10/1997 | Faulk ........................... 429/90 |
| 5,331,268 A | 7/1994 | Patino et al. .................. 320/158 | | 5,684,678 A | 11/1997 | Barrett ........................ 363/17 |
| 5,332,927 A | 7/1994 | Paul et al. ..................... 307/66 | | 5,691,621 A | 11/1997 | Phuoc et al. ................ 320/134 |
| 5,336,993 A | 8/1994 | Thomas et al. ............ 324/158.1 | | 5,699,050 A | 12/1997 | Kanazawa ............... 340/636.13 |
| 5,338,515 A | 8/1994 | Dalla Betta et al. ............ 422/95 | | 5,701,089 A | 12/1997 | Perkins ...................... 324/772 |
| 5,339,018 A | 8/1994 | Brokaw ...................... 320/147 | | 5,705,929 A | 1/1998 | Caravello et al. ........... 324/430 |
| 5,343,380 A | 8/1994 | Champlin ...................... 363/46 | | 5,707,015 A | 1/1998 | Guthrie ....................... 241/120 |
| 5,347,163 A | 9/1994 | Yoshimura .................... 307/66 | | 5,710,503 A | 1/1998 | Sideris et al. ................ 320/116 |
| 5,352,968 A | 10/1994 | Reni et al. ................... 320/136 | | 5,711,648 A | 1/1998 | Hammerslag ................ 414/800 |
| 5,357,519 A | 10/1994 | Martin et al. ................ 371/15.1 | | 5,712,795 A | 1/1998 | Layman et al. .............. 700/297 |
| 5,365,160 A | 11/1994 | Leppo et al. ................. 320/160 | | 5,717,336 A | 2/1998 | Basell et al. ................. 324/430 |
| 5,365,453 A | 11/1994 | Startup et al. ................. 702/36 | | 5,717,937 A | 2/1998 | Fritz ............................ 713/300 |
| 5,369,364 A | 11/1994 | Renirie et al. ............... 324/430 | | 5,721,688 A | 2/1998 | Bramwell .................... 324/426 |
| 5,381,096 A | 1/1995 | Hirzel .......................... 324/427 | | 5,732,074 A | 3/1998 | Spaur et al. .................. 370/313 |
| 5,387,871 A | 2/1995 | Tsai ............................ 324/429 | | 5,739,667 A | 4/1998 | Matsuda et al. ............. 320/128 |
| 5,402,007 A | 3/1995 | Center et al. ............... 290/40 B | | 5,744,962 A | 4/1998 | Alber et al. .................. 324/426 |
| 5,410,754 A | 4/1995 | Klotzbach et al. ............ 370/466 | | 5,745,044 A | 4/1998 | Hyatt, Jr. et al. ............ 340/5.23 |
| 5,412,308 A | 5/1995 | Brown ........................ 323/267 | | 5,747,189 A | 5/1998 | Perkins ........................ 429/91 |
| 5,412,323 A * | 5/1995 | Kato et al. ................... 324/429 | | 5,747,909 A | 5/1998 | Syverson et al. ........ 310/156.56 |
| 5,425,041 A | 6/1995 | Seko et al. ................ 372/45.01 | | 5,747,967 A | 5/1998 | Muljadi et al. ............... 320/148 |
| 5,426,371 A | 6/1995 | Salley et al. ................. 324/429 | | 5,754,417 A | 5/1998 | Nicollini ...................... 363/60 |
| 5,426,416 A | 6/1995 | Jefferies et al. ............... 340/664 | | 5,757,192 A | 5/1998 | McShane et al. ............ 324/427 |
| 5,430,645 A | 7/1995 | Keller ..................... 364/424.01 | | 5,760,587 A | 6/1998 | Harvey ........................ 324/434 |
| 5,432,025 A | 7/1995 | Cox .............................. 29/65 | | 5,772,468 A | 6/1998 | Kowalski et al. ............ 439/506 |
| 5,432,426 A | 7/1995 | Yoshida ....................... 320/160 | | 5,773,962 A * | 6/1998 | Nor .............................. 320/134 |
| 5,434,495 A | 7/1995 | Toko ........................... 320/135 | | 5,773,978 A | 6/1998 | Becker ......................... 324/430 |
| 5,435,185 A | 7/1995 | Eagan ............................ 73/587 | | 5,778,326 A | 7/1998 | Moroto et al. ................. 701/22 |
| 5,442,274 A | 8/1995 | Tamai ......................... 320/146 | | 5,780,974 A | 7/1998 | Pabla et al. .................... 315/82 |
| 5,445,026 A | 8/1995 | Eagan ............................ 73/591 | | 5,780,980 A | 7/1998 | Naito ........................... 318/139 |
| 5,449,996 A | 9/1995 | Matsumoto et al. .......... 320/148 | | 5,789,899 A | 8/1998 | van Phuoc et al. .......... 320/112 |
| 5,449,997 A | 9/1995 | Gilmore et al. .............. 320/148 | | 5,793,359 A | 8/1998 | Ushikubo .................... 345/169 |
| 5,451,881 A | 9/1995 | Finger ......................... 324/433 | | 5,796,239 A | 8/1998 | van Phuoc et al. .......... 320/107 |
| 5,453,027 A | 9/1995 | Buell et al. ................... 439/433 | | 5,808,469 A | 9/1998 | Kopera ........................ 324/434 |
| 5,457,377 A | 10/1995 | Jonsson ....................... 324/430 | | 5,811,979 A | 9/1998 | Rhein .......................... 324/718 |
| 5,459,660 A | 10/1995 | Berra ............................ 701/33 | | 5,818,234 A | 10/1998 | McKinnon .................. 324/433 |
| 5,469,043 A | 11/1995 | Cherng et al. ............... 320/161 | | 5,820,407 A | 10/1998 | Morse et al. ................. 439/504 |
| 5,485,090 A | 1/1996 | Stephens ..................... 324/433 | | 5,821,756 A | 10/1998 | McShane et al. ............ 324/430 |
| 5,488,300 A | 1/1996 | Jamieson ..................... 324/432 | | 5,821,757 A | 10/1998 | Alvarez et al. .............. 324/434 |
| 5,504,674 A | 4/1996 | Chen et al. ..................... 705/4 | | 5,825,174 A | 10/1998 | Parker ......................... 324/106 |
| 5,508,599 A | 4/1996 | Koenck ....................... 320/138 | | 5,831,435 A | 11/1998 | Troy ........................... 324/426 |
| 5,519,383 A | 5/1996 | De La Rosa .............. 340/636.15 | | 5,832,396 A | 11/1998 | Moroto et al. ................. 701/22 |
| 5,528,148 A | 6/1996 | Rogers ........................ 320/137 | | 5,850,113 A | 12/1998 | Weimer et al. .............. 307/125 |
| 5,537,967 A | 7/1996 | Tashiro et al. ............. 123/192.1 | | 5,862,515 A | 1/1999 | Kobayashi et al. ............. 702/63 |
| 5,541,489 A | 7/1996 | Dunstan ...................... 320/134 | | 5,865,638 A | 2/1999 | Trafton ........................ 439/288 |
| 5,546,317 A | 8/1996 | Andrieu ........................ 702/63 | | 5,871,858 A | 2/1999 | Thomsen et al. ................ 429/7 |
| 5,548,273 A | 8/1996 | Nicol et al. .................. 340/439 | | 5,872,443 A | 2/1999 | Williamson ................. 320/160 |
| 5,550,485 A | 8/1996 | Falk ............................ 324/772 | | 5,872,453 A | 2/1999 | Shimoyama et al. ......... 324/431 |
| 5,561,380 A | 10/1996 | Sway-Tin et al. ............ 324/509 | | 5,883,306 A | 3/1999 | Hwang ...................... 73/146.8 |
| 5,562,501 A | 10/1996 | Kinoshita et al. ............ 439/852 | | 5,895,440 A | 4/1999 | Proctor et al. ................. 702/63 |
| 5,563,496 A | 10/1996 | McClure ..................... 320/128 | | 5,903,154 A | 5/1999 | Zhang et al. ................. 324/437 |
| 5,572,136 A | 11/1996 | Champlin .................... 324/426 | | 5,903,716 A | 5/1999 | Kimber et al. ............... 395/114 |
| 5,573,611 A | 11/1996 | Koch et al. ................ 152/152.1 | | 5,912,534 A | 6/1999 | Benedict ....................... 315/82 |
| 5,574,355 A | 11/1996 | McShane et al. ............ 320/161 | | 5,914,605 A | 6/1999 | Bertness ...................... 324/430 |
| 5,578,915 A | 11/1996 | Crouch, Jr. et al. .......... 324/428 | | 5,927,938 A | 7/1999 | Hammerslag ................ 414/809 |
| 5,583,416 A | 12/1996 | Klang ......................... 320/160 | | 5,929,609 A | 7/1999 | Joy et al. ....................... 322/25 |
| 5,585,416 A | 12/1996 | Audett et al. ................. 522/35 | | 5,939,855 A | 8/1999 | Proctor et al. ............... 320/104 |
| 5,585,728 A | 12/1996 | Champlin .................... 324/427 | | 5,939,861 A | 8/1999 | Joko et al. .................... 320/122 |
| 5,589,757 A | 12/1996 | Klang ......................... 320/160 | | 5,945,829 A | 8/1999 | Bertness ...................... 324/430 |
| 5,592,093 A | 1/1997 | Klingbiel .................... 324/426 | | 5,946,605 A | 8/1999 | Takahisa et al. ............... 455/68 |
| 5,592,094 A | 1/1997 | Ichikawa ..................... 324/427 | | 5,950,144 A | 9/1999 | Hall et al. .................... 702/108 |
| 5,596,260 A | 1/1997 | Moravec et al. ............. 320/135 | | 5,951,229 A | 9/1999 | Hammerslag ................ 414/398 |
| 5,596,261 A | 1/1997 | Suyama ...................... 320/152 | | 5,955,951 A | 9/1999 | Wischerop et al. ......... 340/572.8 |
| 5,598,098 A | 1/1997 | Champlin .................... 324/430 | | 5,961,561 A | 10/1999 | Wakefield, II ................. 701/29 |
| 5,602,462 A | 2/1997 | Stich et al. ................... 323/258 | | 5,961,604 A | 10/1999 | Anderson et al. ............ 709/229 |
| 5,606,242 A | 2/1997 | Hull et al. .................... 320/106 | | 5,969,625 A | 10/1999 | Russo ...................... 340/636.19 |
| 5,614,788 A | 3/1997 | Mullins et al. ................. 315/82 | | 5,973,598 A | 10/1999 | Beigel ........................ 340/572.1 |
| 5,621,298 A | 4/1997 | Harvey ....................... 320/134 | | 5,978,805 A | 11/1999 | Carson ........................ 707/10 |
| 5,633,985 A | 5/1997 | Severson et al. ............. 704/267 | | 5,982,138 A | 11/1999 | Krieger ....................... 320/105 |
| 5,637,978 A | 6/1997 | Kellett et al. ................ 320/104 | | 5,990,664 A | 11/1999 | Rahman ...................... 320/136 |
| 5,642,031 A | 6/1997 | Brotto ......................... 320/156 | | 6,002,238 A | 12/1999 | Champlin .................... 320/134 |
| 5,644,212 A * | 7/1997 | Takahashi ................... 320/134 | | 6,005,489 A | 12/1999 | Siegle et al. .............. 340/825.69 |
| 5,650,937 A | 7/1997 | Bounaga ....................... 702/65 | | 6,005,759 A | 12/1999 | Hart et al. ..................... 361/66 |
| 5,652,501 A | 7/1997 | McClure et al. ......... 340/636.15 | | 6,008,652 A | 12/1999 | Theofanopoulos et al. .. 324/434 |
| 5,653,659 A | 8/1997 | Kunibe et al. ................ 477/111 | | 6,009,369 A | 12/1999 | Boisvert et al. ................ 701/99 |
| 5,654,623 A | 8/1997 | Shiga et al. .................. 320/106 | | 6,016,047 A | 1/2000 | Notten et al. ................ 320/137 |
| 5,656,920 A | 8/1997 | Cherng et al. ............... 324/431 | | 6,031,354 A | 2/2000 | Wiley et al. ................. 320/116 |
| 5,661,368 A | 8/1997 | Deol et al. ..................... 315/82 | | 6,031,368 A | 2/2000 | Klippel et al. ............... 324/133 |
| 5,666,040 A | 9/1997 | Bourbeau .................... 320/118 | | 6,037,745 A | 3/2000 | Koike et al. ................. 320/104 |

| Patent No. | Date | Inventor | Class |
|---|---|---|---|
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,136,914 A | 10/2000 | Hergenrother et al. | 524/495 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,147,598 A | 11/2000 | Murphy et al. | 340/426.19 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,191,557 B1 | 2/2001 | Gray et al. | 320/132 |
| 6,211,651 B1 | 4/2001 | Nemoto | 320/133 |
| 6,215,275 B1 | 4/2001 | Bean | 320/106 |
| 6,218,805 B1 | 4/2001 | Melcher | 320/150 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,236,332 B1 | 5/2001 | Conkright et al. | 340/3.1 |
| 6,236,949 B1 * | 5/2001 | Hart | 702/64 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,271,643 B1 | 8/2001 | Becker et al. | 320/112 |
| 6,271,748 B1 | 8/2001 | Derbyshire et al. | 340/442 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,320,351 B1 | 11/2001 | Ng et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 * | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,392,414 B1 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,505,507 B1 | 1/2003 | Imao | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness | 324/426 |
| 6,771,073 B2 | 8/2004 | Henningson et al. | 324/426 |
| 6,777,945 B2 | 8/2004 | Roberts et al. | 324/426 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |

| | | | | | | |
|---|---|---|---|---|---|---|
| 6,795,782 B2 | 9/2004 | Bertness et al. ............ 702/63 | | 2003/0214395 A1 | 11/2003 | Flowerday et al. .......... 340/445 |
| 6,796,841 B1 | 9/2004 | Cheng et al. ............. 439/620.3 | | 2004/0000590 A1 | 1/2004 | Raichle et al. ........... 235/462.01 |
| 6,805,090 B2 | 10/2004 | Bertness et al. ............ 123/198 | | 2004/0000891 A1 | 1/2004 | Raichle et al. ................ 320/107 |
| 6,806,716 B2 | 10/2004 | Bertness et al. ............ 324/426 | | 2004/0000893 A1 | 1/2004 | Raichle et al. ................ 320/135 |
| 6,825,669 B2 | 11/2004 | Raichle et al. ............... 324/426 | | 2004/0002824 A1 | 1/2004 | Raichle et al. .................. 702/63 |
| 6,842,707 B2 | 1/2005 | Raichle et al. ................. 702/62 | | 2004/0002825 A1 | 1/2004 | Raichle et al. .................. 702/63 |
| 6,845,279 B1 | 1/2005 | Gilmore et al. .............. 700/115 | | 2004/0002836 A1 | 1/2004 | Raichle et al. ................ 702/188 |
| 6,850,037 B2 | 2/2005 | Bertness ....................... 320/132 | | 2004/0032264 A1 | 2/2004 | Schoch ......................... 324/426 |
| 6,871,151 B2 | 3/2005 | Bertness ......................... 702/63 | | 2004/0044452 A1 | 3/2004 | Bauer et al. ..................... 703/33 |
| 6,885,195 B2 | 4/2005 | Bertness ....................... 324/426 | | 2004/0049361 A1 | 3/2004 | Hamdan et al. .............. 702/115 |
| 6,888,468 B2 | 5/2005 | Bertness ................... 340/636.15 | | 2004/0051533 A1 | 3/2004 | Namaky ........................ 324/426 |
| 6,891,378 B2 | 5/2005 | Bertness et al. .............. 324/426 | | 2004/0051534 A1* | 3/2004 | Kobayashi et al. ........... 324/429 |
| 6,904,796 B2 | 6/2005 | Pacsai et al. ................. 73/146.8 | | 2004/0054503 A1 | 3/2004 | Namaky ........................ 702/183 |
| 6,906,522 B2 | 6/2005 | Bertness et al. .............. 324/426 | | 2004/0113588 A1 | 6/2004 | Mikuriya et al. .............. 320/128 |
| 6,906,523 B2 | 6/2005 | Bertness et al. .............. 324/426 | | 2004/0145342 A1 | 7/2004 | Lyon ............................ 320/108 |
| 6,906,624 B2 | 6/2005 | McClelland et al. .......... 340/442 | | 2004/0164706 A1* | 8/2004 | Osborne ....................... 320/116 |
| 6,909,287 B2 | 6/2005 | Bertness ....................... 324/427 | | 2004/0178185 A1 | 9/2004 | Yoshikawa et al. ........... 219/270 |
| 6,909,356 B2 | 6/2005 | Brown et al. .................. 340/3.2 | | 2004/0199343 A1 | 10/2004 | Cardinal et al. ................. 702/63 |
| 6,913,483 B2 | 7/2005 | Restaino et al. .............. 439/504 | | 2004/0227523 A1 | 11/2004 | Namaky ........................ 324/537 |
| 6,914,413 B2 | 7/2005 | Bertness et al. .............. 320/104 | | 2004/0239332 A1 | 12/2004 | Mackel et al. ................ 324/426 |
| 6,919,725 B2 | 7/2005 | Bertness et al. .............. 324/433 | | 2004/0251876 A1 | 12/2004 | Bertness et al. .............. 320/136 |
| 6,930,485 B2 | 8/2005 | Bertness et al. .............. 324/426 | | 2005/0007068 A1 | 1/2005 | Johnson et al. ............... 320/110 |
| 6,933,727 B2 | 8/2005 | Bertness et al. .............. 324/426 | | 2005/0017726 A1 | 1/2005 | Koran et al. .................. 324/433 |
| 6,941,234 B2 | 9/2005 | Bertness et al. ................ 702/63 | | 2005/0021294 A1 | 1/2005 | Trsar et al. .................... 702/183 |
| 6,967,484 B2 | 11/2005 | Bertness ....................... 324/426 | | 2005/0025299 A1 | 2/2005 | Tischer et al. ................. 379/199 |
| 6,972,662 B1 | 12/2005 | Ohkawa et al. ............... 340/10.1 | | 2005/0043868 A1 | 2/2005 | Mitcham ......................... 701/29 |
| 6,998,847 B2 | 2/2006 | Bertness et al. .............. 324/426 | | 2005/0057256 A1 | 3/2005 | Bertness ....................... 324/426 |
| 7,003,410 B2 | 2/2006 | Bertness et al. ................ 702/63 | | 2005/0102073 A1 | 5/2005 | Ingram ............................ 701/29 |
| 7,003,411 B2 | 2/2006 | Bertness ......................... 702/63 | | 2005/0128083 A1 | 6/2005 | Puzio et al. ................. 340/572.1 |
| 7,012,433 B2 | 3/2006 | Smith et al. .................. 324/426 | | 2005/0159847 A1 | 7/2005 | Shah et al. .................... 700/276 |
| 7,058,525 B2 | 6/2006 | Bertness et al. ................ 702/63 | | 2005/0168226 A1 | 8/2005 | Quint et al. ................... 324/426 |
| 7,081,755 B2 | 7/2006 | Klang et al. .................. 324/426 | | 2005/0173142 A1 | 8/2005 | Cutler et al. .................. 173/181 |
| 7,098,666 B2 | 8/2006 | Patino ........................... 324/433 | | 2005/0182536 A1 | 8/2005 | Doyle et al. .................... 701/29 |
| 7,102,556 B2* | 9/2006 | White ........................... 341/141 | | 2005/0218902 A1* | 10/2005 | Restaino et al. .............. 324/433 |
| 7,106,070 B2 | 9/2006 | Bertness et al. .............. 324/538 | | 2005/0254106 A9 | 11/2005 | Silverbrook et al. .......... 358/539 |
| 7,116,109 B2 | 10/2006 | Klang ........................... 324/426 | | 2005/0256617 A1 | 11/2005 | Cawthorne et al. ............. 701/22 |
| 7,119,686 B2 | 10/2006 | Bertness et al. ............ 340/572.1 | | 2006/0012330 A1 | 1/2006 | Okumura et al. .............. 320/103 |
| 7,120,488 B2 | 10/2006 | Nova et al. ....................... 600/2 | | 2006/0030980 A1 | 2/2006 | St. Denis ........................ 701/29 |
| 7,126,341 B2 | 10/2006 | Bertness et al. .............. 324/426 | | 2006/0089767 A1 | 4/2006 | Sowa .............................. 701/29 |
| 7,129,706 B2 | 10/2006 | Kalley .......................... 324/426 | | 2006/0217914 A1 | 9/2006 | Bertness ....................... 702/113 |
| 7,182,147 B2 | 2/2007 | Cutler et al. ...................... 173/1 | | 2006/0282323 A1 | 12/2006 | Walker et al. ................... 705/14 |
| 7,184,905 B2 | 2/2007 | Stefan ............................. 702/63 | | 2007/0024460 A1 | 2/2007 | Clark ............................ 340/663 |
| 7,200,424 B2 | 4/2007 | Tischer et al. ................ 455/567 | | 2007/0026916 A1 | 2/2007 | Juds et al. ......................... 463/1 |
| 7,209,850 B2 | 4/2007 | Brott et al. .................... 324/426 | | 2007/0194791 A1 | 8/2007 | Huang .......................... 324/430 |
| 7,209,860 B2 | 4/2007 | Trsar et al. .................... 702/183 | | 2008/0036421 A1* | 2/2008 | Seo et al. ...................... 320/132 |
| 7,212,887 B2 | 5/2007 | Shah et al. .................... 700/276 | | 2008/0303528 A1 | 12/2008 | Kim .............................. 324/430 |
| 7,219,023 B2* | 5/2007 | Banke et al. .................... 702/58 | | 2008/0303529 A1 | 12/2008 | Nakamura et al. ............ 324/433 |
| 7,233,128 B2* | 6/2007 | Brost et al. ................... 320/130 | | 2010/0145780 A1 | 6/2010 | Nishikawa et al. ......... 705/14.11 |
| 7,235,977 B2 | 6/2007 | Koran et al. .................. 324/426 | | 2010/0314950 A1 | 12/2010 | Rutkowski et al. ............ 307/125 |
| 7,272,519 B2 | 9/2007 | Lesesky et al. ................ 702/63 | | 2011/0004427 A1 | 1/2011 | Gorbold et al. ................. 702/63 |
| 7,339,477 B2 | 3/2008 | Puzio et al. ................. 340/572.1 | | | | |
| 7,446,536 B2 | 11/2008 | Bertness ....................... 324/426 | | FOREIGN PATENT DOCUMENTS | | |
| 7,453,238 B2* | 11/2008 | Melichar ....................... 320/116 | | | | |
| 7,657,386 B2 | 2/2010 | Thibedeau et al. .............. 702/63 | | DE | 19638324 | 9/1996 |
| 7,679,325 B2* | 3/2010 | Seo ............................... 320/116 | | EP | 0 022 450 A1 | 1/1981 |
| 7,728,556 B2* | 6/2010 | Yano et al. .................... 320/134 | | EP | 0 637 754 A1 | 2/1995 |
| 2001/0035737 A1 | 11/2001 | Nakanishi et al. ............ 320/122 | | EP | 0 772 056 A1 | 5/1997 |
| 2002/0004694 A1 | 1/2002 | McLeod ......................... 701/29 | | EP | 0 982 159 A2 | 3/2000 |
| 2002/0010558 A1 | 1/2002 | Bertness et al. ................ 702/63 | | FR | 2 749 397 | 12/1997 |
| 2002/0021135 A1* | 2/2002 | Li et al. ......................... 324/677 | | GB | 2 029 586 | 3/1980 |
| 2002/0041175 A1 | 4/2002 | Lauper et al. ................. 320/106 | | GB | 2 088 159 A | 6/1982 |
| 2002/0044050 A1 | 4/2002 | Derbyshire et al. .......... 340/442 | | GB | 2 246 916 A | 10/1990 |
| 2002/0118111 A1 | 8/2002 | Brown et al. ............... 340/573.1 | | GB | 2 275 783 A | 7/1994 |
| 2002/0171428 A1* | 11/2002 | Bertness ....................... 324/426 | | GB | 2 387 235 A | 10/2003 |
| 2002/0176010 A1 | 11/2002 | Wallach et al. ............... 348/362 | | JP | 59-17892 | 1/1984 |
| 2003/0009270 A1 | 1/2003 | Breed ............................ 701/29 | | JP | 59-17893 | 1/1984 |
| 2003/0025481 A1 | 2/2003 | Bertness ....................... 324/426 | | JP | 59-17894 | 1/1984 |
| 2003/0036909 A1 | 2/2003 | Kato ............................. 704/275 | | JP | 59017894 | 1/1984 |
| 2003/0040873 A1 | 2/2003 | Lesesky et al. ................ 702/57 | | JP | 59215674 | 12/1984 |
| 2003/0078743 A1 | 4/2003 | Bertness et al. ................ 702/63 | | JP | 60225078 | 11/1985 |
| 2003/0088375 A1 | 5/2003 | Bertness et al. ................ 702/63 | | JP | 62-180284 | 8/1987 |
| 2003/0128036 A1 | 7/2003 | Henningson et al. ......... 324/426 | | JP | 63027776 | 2/1988 |
| 2003/0169018 A1 | 9/2003 | Berels et al. .................. 320/132 | | JP | 03274479 | 12/1991 |
| 2003/0184262 A1 | 10/2003 | Makhija ........................ 320/156 | | JP | 03282276 | 12/1991 |
| 2003/0184306 A1 | 10/2003 | Bertness et al. .............. 324/426 | | JP | 4-8636 | 1/1992 |
| 2003/0187556 A1 | 10/2003 | Suzuki .......................... 701/29 | | JP | 04095788 | 3/1992 |
| 2003/0194672 A1 | 10/2003 | Roberts et al. ................ 431/196 | | JP | 04131779 | 5/1992 |
| 2003/0197512 A1 | 10/2003 | Miller et al. .................. 324/426 | | JP | 04372536 | 12/1992 |
| 2003/0212311 A1 | 11/2003 | Nova et al. .................... 600/300 | | JP | 05211724 A | 8/1993 |
| | | | | JP | 5216550 | 8/1993 |

| | | |
|---|---|---|
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"Electrochemical Impedance Spectroscopy in Battery Development and Testing", *Batteries International*, Apr. 1997, pp. 59 and 62-63.
"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113.006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Wilihncanz, *The Electrochemical Society*, preprint 79-20, Apr. 1941, pp. 253-258.
National Semiconductor Corporation, "High Q Notch Filter", 3/69, Linear Brief 5, Mar. 1969.
Burr-Brown Corporation, "Design A 60 Hz Notch Filter with the UAF42", 1/94, AB-071, 1994.
National Semiconductor Corporation, "LMF90-$4^{th}$-Order Elliptic Notch Filter", Dec. 1994, RRD-B30M115, Dec. 1994.
"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.
"Simple DC-DC Converts Allows Use of Single Battery", *Electronix Express*, downloaded from http://www.elexp.com/t_dc-dc.htm, undated.
"DC-DC Converter Basics", *Power Designers*, downloaded from http://www.powederdesigners.com/InforWeb.design_center/articles/DC-DC/converter.sthm, undated.
"Notification of Transmittal of the International Search Report or the Declaration", PCT/US02/29461.
"Notification of Transmittal of the International Search Report or the Declaration", PCT/US03/07546.
"Notification of Transmittal of the International Search Report or the Declaration", PCT/US03/06577.
"Notification of Transmittal of the International Search Report or the Declaration", PCT/US03/07837.
"Improved Impedance Spectroscopy Technique For Status Determination of Production Li/SO$_2$ Batteries" Terrill Atwater et al., pp. 10-113, (1992).
"Notification of Transmittal of the International Search Report or the Declaration", PCT/US03/41561.
"Notification of Transmittal of the International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois pp. 1-1-14-13, (1991).
Supplementary European Search Report Communication for Appl. No. 99917402.2.
"Dynamic modelling of lead/acid batteries using impedance spectroscopy for parameter identification", Journal of Power Sources, pp. 69-84, (1997).
Notification of Transmittal of the International Search Report for PCT/US03/30707.
"A review of impedance measurements for determination of the state-of-charge or state-of-health of secondary batteries", Journal of Power Sources, pp. 59-69, (1998).
"Search Report Under Section 17" for Great Britain Application No. GB0421447.4.
"Results of Discrete Frequency Immittance Spectroscopy (DFIS) Measurements of Lead Acid Batteries", by K.S. Champlin et al., *Proceedings of $23^{rd}$ International Teleco Conference (INTELEC)*, published Oct. 2001, IEE, pp. 433-440.
"Examination Report" from the U.K. Patent Office for U.K. App. No. 0417678.0.
Wikipedia Online Encyclopedia, Inductance, 2005, http://en.wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
"A Microprocessor-Based Control System for a Near-Term Electric Vehicle", Bimal K. Bose; IEEE Transactions on Industry Application, vol. IA-17, No. 5, Nov./Dec. 1981; 6 pages.
"DSP Applications in Hybrid Electric Vehicle Powertrain", Miller et al., Proceedings of the American Control Conference San Diego CA Jun. 1999 pp. 2137-2138.
"Notification of Transmittal of the Int'l Search Report and the Written Opinion . . . ", PCT/US2008/008702 filed Jul. 17, 2008; 15 pages.
Examination Report from corresponding Great Britain Application No. GB1000773.0, dated Feb. 6, 2012.
Search Report and Written Opinion from PCT Application No. PCT/US2011/026608, dated Aug. 29, 2011, 9 pgs.
Search Report and Written Opinion from PCT Application No. PCT/US2011/038279, dated Sep. 16, 2011, 12 pgs.

\* cited by examiner

BATTERY TESTER FOR ELECTRIC VEHICLE

CROSS-REFERENCE TO RELATED APPLICATION

The present application is based on and claims the benefit of U.S. provisional patent application Ser. No. 60/950,182, filed Jul. 17, 2007, and U.S. provisional patent application Ser. No. 60/970,319, filed Sep. 6, 2007, the contents of which are hereby incorporated by reference in their entirety.

BACKGROUND OF THE INVENTION

The present invention relates to test equipment for electric vehicles. More specifically, the present invention relates to a tester for testing electrical systems of an electric vehicle.

Various battery testing techniques and related technologies have been pioneered by Midtronics Inc. and Dr. Keith S. Champlin, including for example: U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. No. 6,456,045; U.S. Pat. No. 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued Mar. 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 10/783,682, filed Feb. 20, 2004, entitled REPLACEABLE CLAMP FOR ELECTRONIC BATTERY TESTER; U.S. Ser. No. 10/791,141, filed Mar. 2, 2004, entitled METHOD AND APPARATUS FOR AUDITING A BATTERY TEST; U.S. Ser. No. 10/867,385, filed Jun. 14, 2004, entitled ENERGY MANAGEMENT SYSTEM FOR AUTOMOTIVE VEHICLE; U.S. Ser. No. 10/896,834, filed Jul. 22, 2004, entitled ELECTRONIC BATTERY TESTER; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; U.S. Ser. No. 11/063,247, filed Feb. 22, 2005, entitled ELECTRONIC BATTERY TESTER OR CHARGER WITH DATABUS CONNECTION; U.S. Ser. No. 60/665,070, filed Mar. 24, 2005, entitled OHMMETER PROTECTION CIRCUIT; U.S. Ser. No. 11/141,234, filed May 31, 2005, entitled BATTERY TESTER CAPABLE OF IDENTIFYING FAULTY BATTERY POST ADAPTERS; U.S. Ser. No. 11/143,828, filed Jun. 2, 2005, entitled BATTERY TEST MODULE; U.S. Ser. No. 11/146,608, filed Jun. 7, 2005, entitled SCAN TOOL FOR ELECTRONIC BATTERY TESTER; U.S. Ser. No. 60,694,199, filed Jun. 27, 2005, entitled GEL BATTERY CONDUCTANCE COMPENSATION; U.S. Ser. No. 11/178,550, filed Jul. 11, 2005, entitled WIRELESS BATTERY TESTER/CHARGER; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/352,945, filed Feb. 13, 2006, entitled BATTERY TESTERS WITH SECONDARY FUNCTIONALITY; U.S. Ser. No. 11/356,299, filed Feb. 16, 2006, entitled CENTRALLY MONITORED SALES OF STORAGE BATTERIES; U.S. Ser. No. 11/356,443, filed Feb. 16, 2006, entitled ELECTRONIC BATTERY TESTER WITH NETWORK COMMUNICATION; U.S. Ser. No. 11/498,703, filed Aug. 3, 2006, entitled THEFT PREVENTION DEVICE FOR AUTOMOTIVE VEHICLE SERVICE CENTERS; U.S. Ser. No. 11/507,157, filed Aug. 21, 2006, entitled APPARATUS AND METHOD FOR SIMULATING A BATTERY TESTER WITH A FIXED RESISTANCE LOAD; U.S. Ser. No. 11/511,872, filed Aug. 29, 2006, entitled AUTOMOTIVE VEHICLE ELECTRICAL SYSTEM DIAGNOSTIC DEVICE; U.S. Ser. No. 11/519,481, filed Sep. 12, 2006, entitled BROAD-BAND LOW-CONDUCTANCE CABLES FOR MAKING KELVIN CONNECTIONS TO ELECTROCHEMICAL CELLS AND BATTERIES; U.S. Ser. No. 60/847,064, filed Sep. 25, 2006, entitled STATIONARY BATTERY MONITORING ALGORITHMS; U.S. Ser. No. 11/638,771, filed Dec. 14, 2006, entitled BATTERY MONITORING SYSTEM; U.S. Ser. No. 11/641,594, filed Dec. 19, 2006, entitled METHOD AND APPARATUS FOR MEASURING A PARAMETER OF A VEHICLE ELECTRONIC SYSTEM; U.S. Ser. No. 11/711,356, filed Feb. 27, 2007, entitled BATTERY TESTER WITH PROMOTION FEATURE; U.S. Ser. No. 11/811,528, filed Jun. 11, 2007, entitled ALTERNATOR TESTER; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 11/931,907, filed Oct. 31, 2007, entitled BATTERY MAINTENANCE WITH PROBE LIGHT; U.S. Ser. No. 60/992,798, filed Dec. 6, 2007, entitled STORAGE BATTERY AND BATTERY TESTER; U.S. Ser. No. 12/099,826, filed Apr. 9, 2008, entitled BATTERY RUN DOWN INDICATOR; U.S. Ser. No. 61/061,848, filed Jun. 16, 2008, entitled KELVIN CLAMP FOR ELECTRONICALLY COUPLING TO A BATTERY CONTACT; which are incorporated herein in their entirety.

Many electric vehicles use a battery or other electrical storage device to store energy for use in operating the electric vehicle. Some such electric vehicles use energy recovering (or "regeneration") techniques in which potentially waste energy is recovered and stored in the energy storage device. One example is recovery of energy from the braking function. The energy in braking is recovered as electrical energy rather than being dissipated as excess heat. The energy storage device should be able to sufficiently store the excess energy, as well as deliver energy to the electrical motor of the electric vehicle. Due to the increasing price of petroleum, hybrid systems are rapidly proliferating, and are outpacing the ability to test those systems. There is an ongoing need to test the electrical systems of such electric vehicles.

SUMMARY OF THE INVENTION

Testing or diagnostics are performed on an electric vehicle. The vehicle is operated and current flow through a system of the vehicle is monitored. A voltage related to the system is also monitored. Diagnostics are provided based upon the monitored voltage and the monitored current.

DETAILED DESCRIPTION OF ILLUSTRATIVE EMBODIMENTS

Figure 1:
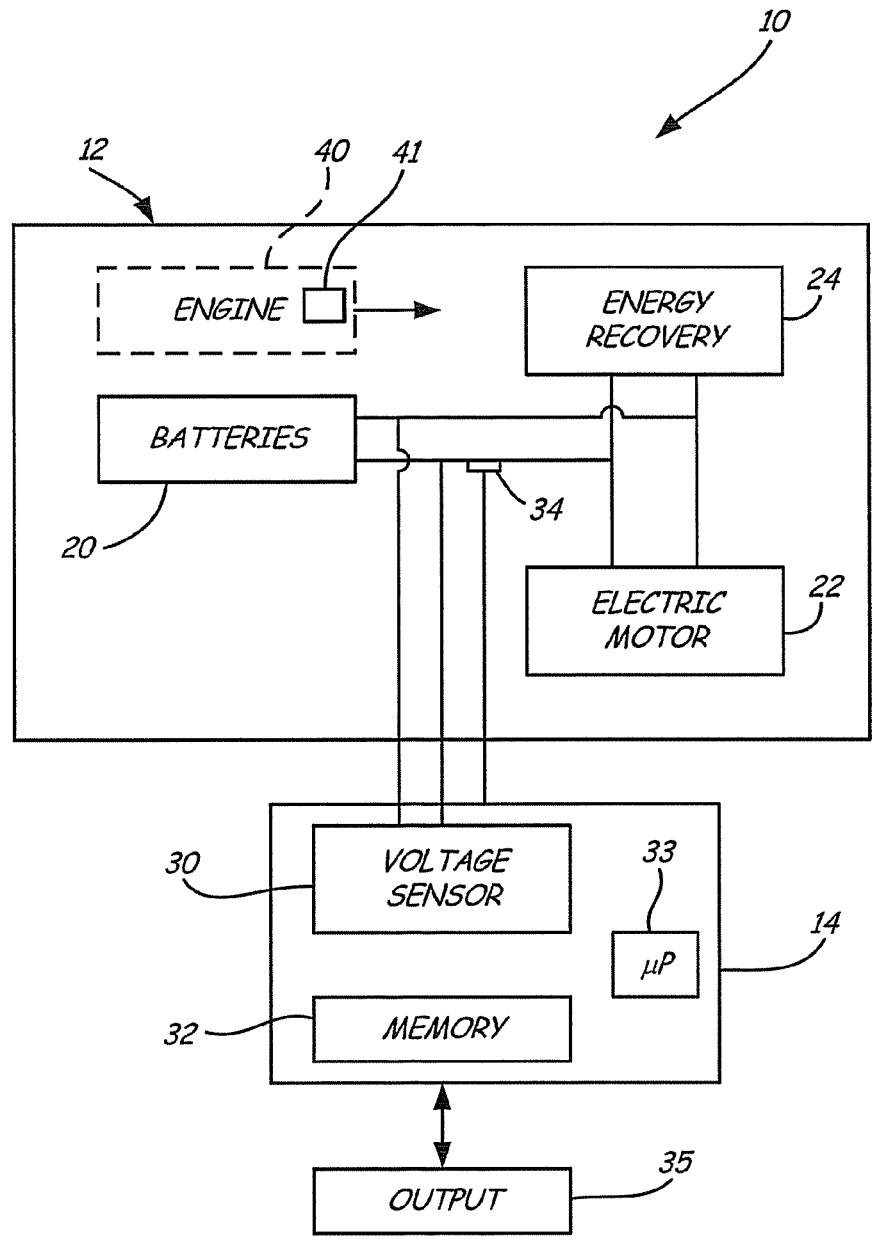
FIG. 1 is a simplified block diagram showing a battery tester in accordance with the present invention coupled to a electric vehicle.

Electric vehicles are becoming increasingly popular as an alternative to traditional vehicles which are powered solely by an internal combustion engine. In a electric vehicle, a large battery or a group of batteries, or other energy storage device, is used to store electrical energy. The stored electrical power is used by an electric motor to power the electric vehicle.

In order to increase energy efficiency, some electric vehicles use various techniques to capture or otherwise recover waste energy. This may be referred to as "regeneration". The recovered energy is typically returned in the battery of the electric vehicle for storage and subsequent use.

Various techniques are used to recover energy. For example, one common technique is to use the braking system of the electric vehicle to convert vehicle motion into electricity for storage in the battery. This differs from a conventional braking system in which excess energy is vented into the atmosphere as heat.

As the battery of the electric vehicle ages, its ability to store energy also degrades. However, this may not be apparent to the operator, particularly in a hybrid vehicle. One symptom of a failing battery is decreased mileage of the electric vehicle because the battery is not able to effectively store or deliver energy. The health of a battery in a electric vehicle is an indication of how well the battery accepts a charge and delivers stored energy at high rates. To some extent, this relates to the amp hour capacity of the battery as well as the ability of the battery to accept or deliver charge in a given time. This is related to how much recovered energy can be stored at one time for later use. For example, is the battery capable of storing energy from many braking cycles for subsequent use, or only a few.

Typical battery testing techniques are difficult to implement in such a electric vehicle. For example, it may be difficult or impossible to access the individual batteries or cell for testing. This may require a great deal of labor. Further, there may be safety concerns related to the relatively high voltages involved.

With the present invention, a current sensor is coupled to the battery pack of a electric vehicle of the type which includes an electric motor to move the electric vehicle. The current sensor can be placed in line with the battery pack and arranged to measure current into and out of the pack. The total string voltage of the battery pack is also measured. A technician or other service personnel performs a battery test by operating the electric vehicle through a number of braking and acceleration cycles. Data is collected and compared to baseline or nominal data which is representative of operation of a new electric vehicle. An output can be provided based upon the comparison. For example, the output can be an indication of how well the electric vehicle compares to new electric vehicle, for example as a percentage.

The current sensor can be placed in series with one of the battery terminals using a shunt resistance or the like. Another example is a Hall effect or other non intrusive sensor. Such a sensor is advantageous because it does not require the battery to be disconnected. In another example, an adapter can be configured which can be inserted between the battery pack and the electric vehicle such that the test device can be coupled to the battery.

The various sensors can be coupled at any convenient location, for example, proximate the battery pack, under the hood, near the electric vehicle motor or other electronics. In such an application, a Hall effect sensor may be sufficient because of the relatively large magnitudes of the current levels being monitored. Further, a Hall effect sensor may be easily "zeroed" because during installation there will be no current flowing. Voltage measurements may be made using direct attachment, for example, to the high voltage pole of the battery. The voltage measurements may also be obtained through other techniques, for example, through an OBDII interface used to read the voltage from the electric vehicle computer system. This may be preferable when using a wireless communication port.

During testing, the test device can provide instructions to an operator as to how to operate the electric vehicle. Such instructions can be provided, for example, through a wireless communication link to a device, through a PDA-type device, through audible instructions, through a display of the vehicle, or through other techniques.

If the testing device couples to the OBDII system of the electric vehicle, additional information can be retrieved. For example, information related to the RPM of a motor, electric vehicle speed, braking information, etc. can be recovered. With this additional information, the test device may be used to verify that the technician has performed the required operations. Of course, such operations should have some flexibility in order to reflect safe driving conditions.

FIG. 1 is a simplified block diagram 10 of a electric vehicle 12 coupled to a test device 14. The test device is shown as being separate from the electric vehicle and may be a portable or stationary device. However, in some configurations the test device 14 may be included in electric vehicle 12. Electric vehicle 12 is illustrated as including battery pack 20, electric motor 22 and energy recovery device 24. As discussed, the battery pack 20 is used to power the electric motor 22 while the energy recover device 24 is used to recover energy during electric vehicle operation. Test circuitry 14 couples to battery 20 and includes or is coupled to voltage sensor 30, memory 32 and microprocessor 33. Further, test circuitry 14 includes or is coupled to a current sensor 34 arranged to sensor current into and/or out of battery pack 20. Test circuitry 14 provides an output through input/output (I/O) 35 as discussed above related to the condition of the battery pack 20. The test circuitry 14 includes a microprocessor 33 or the like which may include either internal or external analog to digital converters configured to convert the sensed voltage current levels to digital values. Microprocessor 33 operates in accordance with instructions stored in memory and provide an output 35 which is related to the condition of the battery pack 20. FIG. 1 also shows an optional internal combustion engine 40 which is used to supplement the energy delivered by battery pack 20. The optional engine 40 can be used to charge battery pack 20, and/or can be used to supplement the electrical power available to motor 22 during times of high acceleration or the like. Thus, engine 40 may include an electric generator 41.

Figure 2:
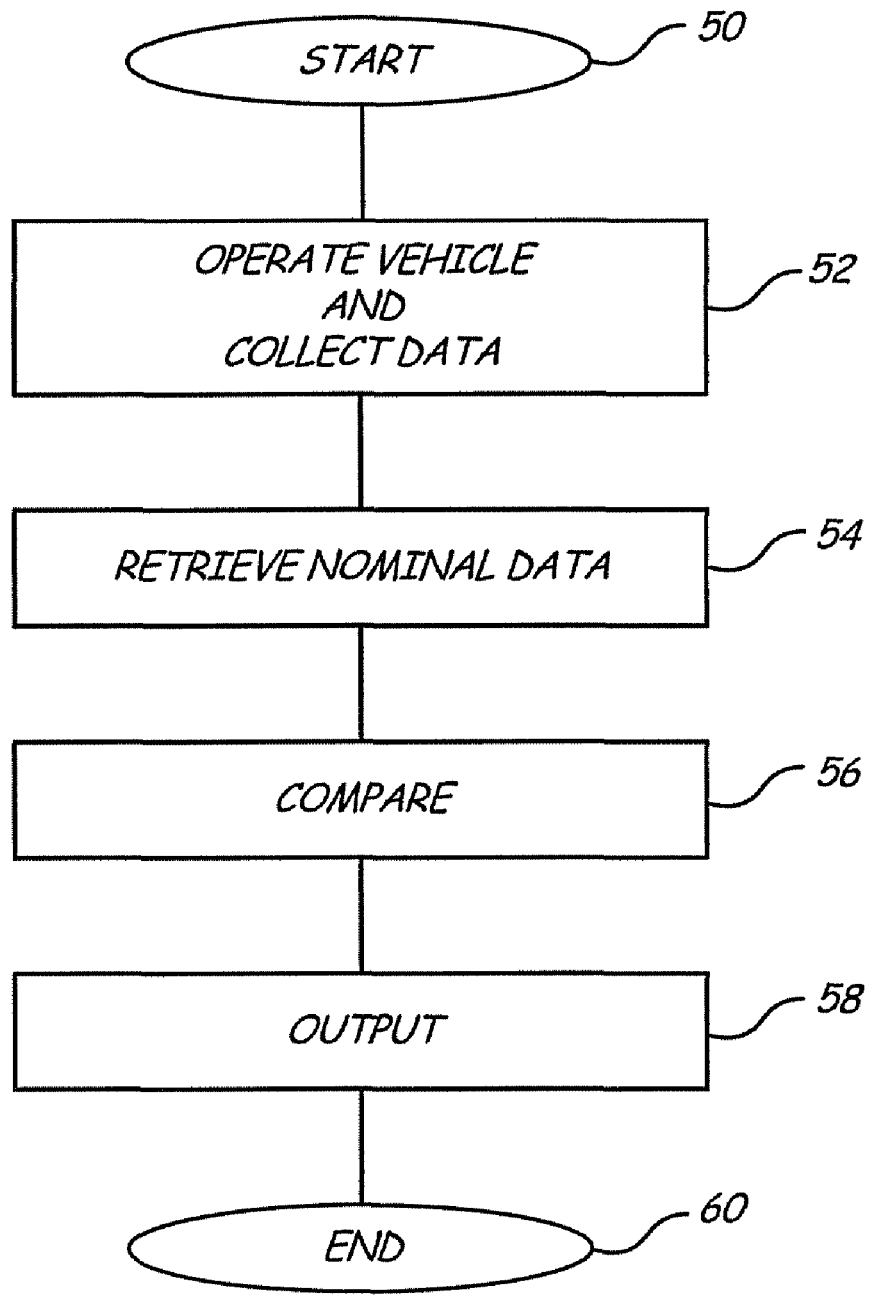
FIG. 2 is a simplified block diagram showing steps in accordance with the present invention.

FIG. 2 is a simplified block diagram showing steps in accordance with one example embodiment of the present invention. The block diagram of FIG. 2 begins at start block 50 and controls past block 52 where the electric vehicle is operated and data is collected. At block 54, nominal data is recovered. For example, such nominal data can be stored in memory 32 shown in FIG. 1. The nominal data can be related to a baseline condition, for example, the condition of the battery in electric vehicle when they are new. At block 56, the collected data is compared to the nominal data and output is provided at block 58. The output can be, for example, a relative output with respect to the current condition of electric vehicle in battery relative to a new electric vehicle or battery. This may be in the form of, for example, a percentage or other format. At block 60, the process is terminated.

Figure 3:
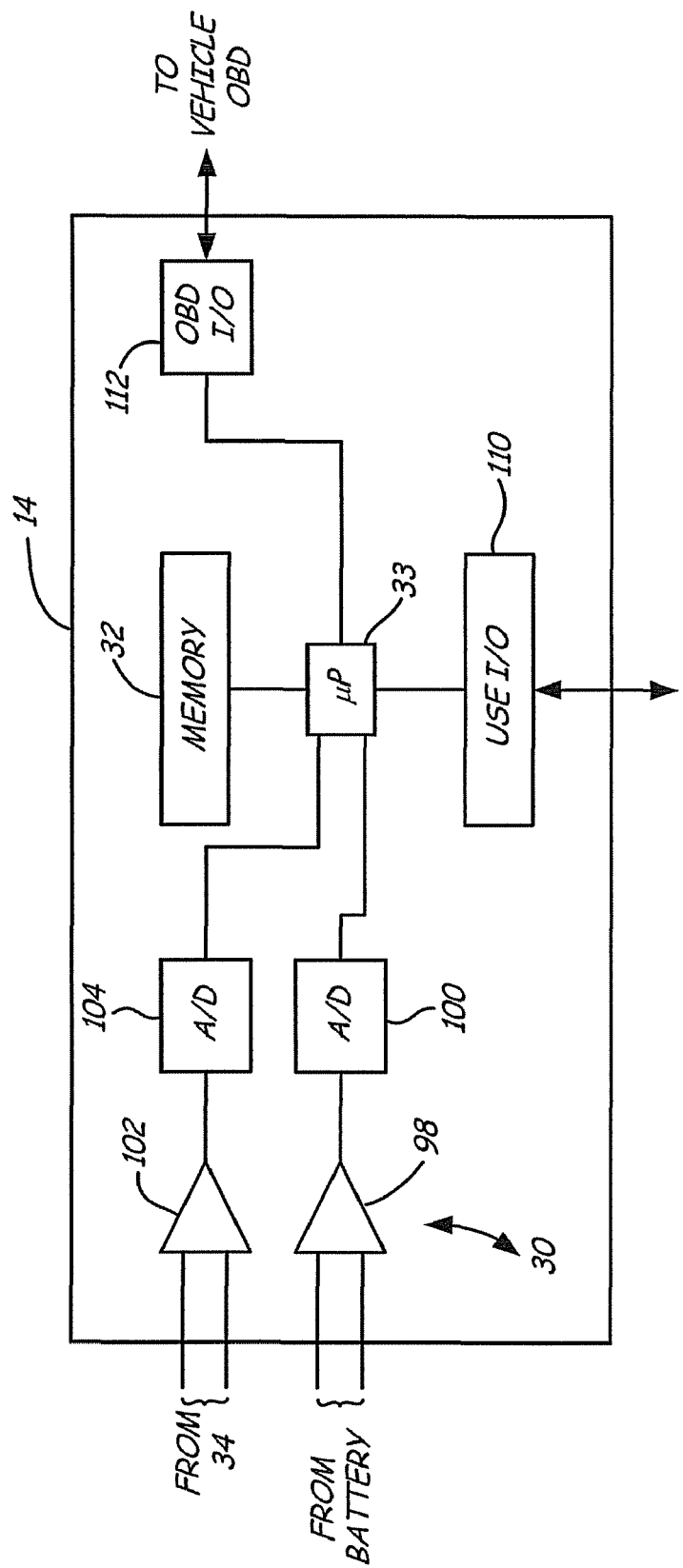
FIG. 3 is a simplified block diagram which illustrates a test device in accordance with the present invention.

FIG. 3 is a simplified block diagram showing test device 14 in greater detail. Test device 14 is illustrated as including differential amplifier 102 which couples to current sensor 34. A second differential amplifier 98 couples to battery 20 and forms the voltage sensor 30. The voltage sensor 30 may be a part of, or may be separated from, the test device 14. The output from the amplifier 98 is provided through an analog to digital converter 100 which couples microprocessor 33. Similarly, the output of amplifier 102 is converted into a digital format for microprocessor 33 using analog to digital converter 104. The actual voltage and current sensors may be in accordance with any technique and is not limited to the techniques described herein. As discussed below, the current and voltage sensors may be a part of vehicle 12 and the test can retrieve their information over a databus of the vehicle.

Microprocessor 33 operates in accordance with instructions stored in memory 32 and is configured to communicate with an operator through user I/O 110. An optional OBD interface, as illustrated at OBD I/O 112, is provided. OBD I/O 112 is configured to couple to the OBD databus of the electric vehicle 12. The user I/O 110 can be any type of user input and output including, for example, a button or keypad entry, a display including a graphical display, an audio output including voice prompts, or other input or output techniques.

Figure 4:
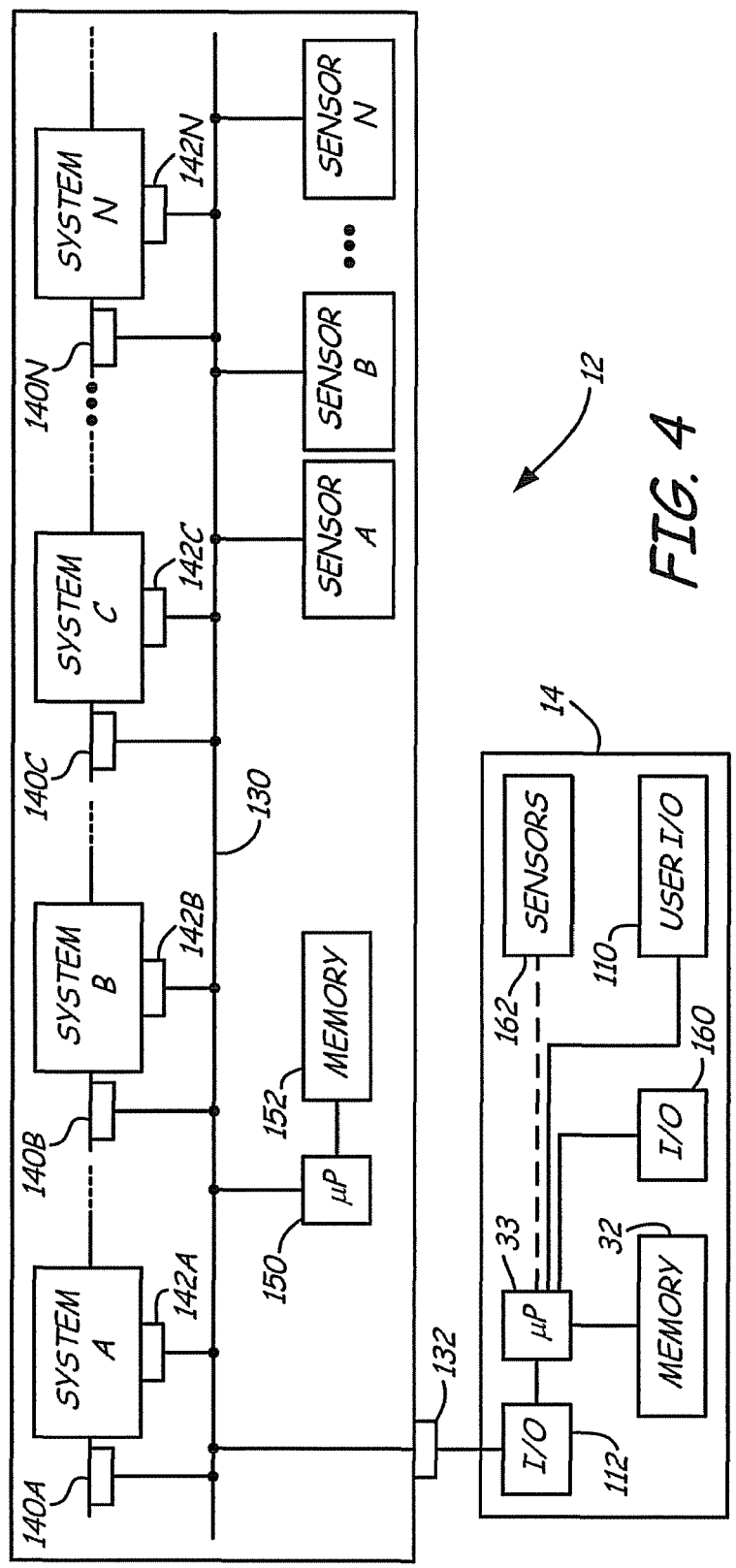
FIG. 4 is a simplified block diagram showing one aspect of the present invention in which the test device couples to the databus of the electric vehicle.

FIG. 4 is a simplified block diagram showing another aspect of the present invention. As discussed above, test device 14 couples to the on board databus 130 of electric vehicle 12, for example through OBD connector 132. Electric vehicle 12 is illustrated as including a plurality of systems identified as System A, B, C through System N. These systems can be any active or passive electrical component or set of components within the vehicle including a motor or motors of the vehicle, an energy recovery system such as a regenerative braking system, a battery cell, a block of cells, a battery pack, vehicle electronics such as audio systems, defrosters, wipers, adjustable seat motors, set heaters, lights both internal and external, computer systems, electrical system associated with an electric or internal combustion motor, charging systems, or others. Each of the systems A-N is illustrated as having a current sensor 140A-140N, respectively and a voltage sensor 142A-142N, respectively. The multiple current sensors 140 and voltage sensors 142 are provided for illustrative purposes only and a particular system within the vehicle may be have neither type of sensor, may have a single sensor, or may have multiple sensors. The outputs from the current sensors 140 the voltage sensors 142 are provided to the internal databus of the electric vehicle 130. The electric vehicle 12 may include additional sensors for sensing physical properties such as temperature, moisture content, fluid levels, pressures, speed or rate of rotation of motors, flow rate, whether a switch is opened or closed, etc. These sensors are illustrated in FIG. 4 as sensor A, B through sensor N and are also coupled to the databus 130 of electric vehicle 12. The sensors A, B, . . . N may be associated with any of the above discussed systems A-N, or with other components or aspects of the electric vehicle 12. For example, a particular sensor may provide a temperature reading of a particular system, or other measurement related to the system. Note that the coupling of the various sensors to the databus 130 may be direct or indirect. For example, data from a particular sensor may be provided to another component, such as directly to a microprocessor 150 of the electric vehicle. Subsequently, the microprocessor 150 may provide the information on databus 130. The data from the various sensors may be optionally stored in an internal memory 152 of the electric vehicle 12. In FIG. 4, the memory 152 is illustrated as being coupled to microprocessor 150. However, this may be optional and the memory 152 can be coupled to databus 130, either directly or through some other components. In one aspect of the present invention, test device 14 monitors information from sensors within the electric vehicle in order to provide enhanced diagnostics without requiring connection of additional sensors to the vehicle. This is achieved by retrieving data through the databus 130 of the electric vehicle as the various sensors within the vehicle communicate information.

In measuring electrical parameters of components, it is often desirable to couple to the electrical component through a four point "Kelvin" connection. In such a configuration, a first pair of connections are used to measure a voltage across the component while a second pair of connections are used to carry current. Kelvin connections reduce errors in the measurements associated with the electrical leads and wiring which are used to couple to the component. However, in many electric vehicles, it is extremely difficult to place Kelvin connectors onto the various electrical components. Further, even if such connections are made, they may carry high voltages which may be unsafe for an operator. Therefore, it is often difficult to couple to the electrical systems of an electric vehicle using traditional Kelvin connection techniques which have been associated with the automotive industry.

In one aspect, the present invention provides a "virtual" Kelvin connection to electrical components of the vehicle. The "virtual" Kelvin connection is embodied in microprocessor 33 of the test device 14. Microprocessor 33 receives current and voltage information from a pair of sensors, such as current sensor 140A and voltage sensor 142A, which are coupled to a component of the vehicle such as system A. Using this information, the microprocessor 33 is capable of calculating an electrical parameter associated with that particular system. For example, electrical resistance can be calculated using ohms law as $R=V/I$. However, other electrical parameters can be calculated such as conductance. Further still, if the electricity through the system has a time varying component, it is possible to determine dynamic parameters of the system such as dynamic resistance or conductance. Complex parameters such as impedance, reactance, etc. of the particular system can also be determined. Note that there may be a lag or time delay between the two measurements (voltage and current) due to delays in the databus 130 or from other sources. Microprocessor 33 can compensate for such a lag by determining, or at least approximating, the duration of the delay. One technique which can be used is by monitoring a function or activity within the vehicle, for example, a braking function, while monitoring the outputs from the associated current and voltage sensors. Based upon when the current and voltage begin to change relative to one another, it is possible to compensate for any delays if the relationship is known. For example, the voltage and current may be expected to rise simultaneously in some systems. If there is a lag in the voltage measurement, for example, the duration of that lag can be measured by microprocessor 33 and used to compensate subsequent measurements. Similarly, a particular sensor may have a relatively long response time, or the databus 130 may be of a sufficiently slow data rate that sufficient band width may not be available to measure or monitor a rapidly changing voltage or current. Again, compensation techniques can be used to at least partially address such a shortcoming, for example, by providing a compensated frequency response profile for a particular sensor.

During operation, microprocessor 33 collects data from a desired system (A-N) of electric vehicle 12 using the associated current sensor 140A-N and/or voltage sensor 140A-N as desired. The microprocessor 33 can also use information collected from other sensors of the electric vehicle, such as sensors A, B and C for use in testing. If a measurement is desired across multiple systems, it is possible to add or subtract the measurement currents and voltages to obtain such a measurement depending upon the configuration of the sensors. As discussed above, the data is retrieved from databus 130 using OBD I/O circuitry 112 coupled to the databus 130 through OBD connector 132. In addition to having a user input/output 110, another optional input/output 160 is illustrated. I/O 160 can comprise circuitry for providing data to, or receiving data from, another device such as a remote location which collects data or measurements, a printer, a remote control or display for use by an operator, remote sensors, etc. Additionally, other optional sensors 162 are shown in test device 14 of FIG. 4. Sensors 162 may comprise other sensors used to perform diagnostics including physical Kelvin connectors, current and/or voltage sensors, temperature sensors, etc. The user I/O circuitry 110 can be used to provide an interface for an operator during testing of electric vehicle 12. For example, the operator can instruct the test device 14 as to which of the systems of electric vehicle 12 to test, a selected test to perform, provide information regarding electric vehicle 12, etc. The I/O circuitry 110 can also be used to provide information to the operator such as the results of the test, intermediary results, information regarding past tests, information regarding the electric vehicle or other information. Additionally, if a particular test requires the electric vehicle to be operated in a particular manner, the user I/O circuitry 110 can provide instructions to the operator. For example, the particular test being performed may require that the electric vehicle be accelerated, or that the brake be applied, that the electric vehicle be stopped for a period, or other actions. The instructions to an operator may be in the form of, for example, audible instructions which may be easily implemented when driving the electric vehicle. Using the data collected from the sensors, microprocessor 33 can diagnose the systems and operation of electric vehicle 12. In one example of the present invention, the information can be used to perform any type of diagnostics such as those known in the art. Various types of diagnostics include measuring parameters of systems of the electric vehicle, monitoring the amount of energy recovered during an energy regenerative process such as by recovering energy during a braking function, determining the maximum amount of energy which may be recovered, or the maximum amount of energy which the energy storage device can accept at any one time during recharging, monitoring the energy storage device as it ages to identify a loss of the capacity to store recovered energy or the overall capacity of the storage device, monitoring the maximum energy which the energy storage device is capable of delivering, etc.

For example, one diagnostic technique includes monitoring a parameter of a cell or block of cells of the battery pack 20 and observing changes over time, for example changes in impedance, conductance, resistance, or other parameters including dynamic parameters. Another example diagnostic includes comparing parameters measured for a particular cell or block of cells of the battery pack 20 and observing any imbalances between cells or blocks of cells, or other indications that a particular cell or block of cells is not operating in a manner which is similar to the remaining cells or blocks of cells. This may be through statistical techniques such as observing the distribution of measurements of cells or blocks of cells, etc. Another example diagnostic technique is simply observing voltage differences across cells or blocks of cells in the battery 10.

In another example, the user I/O 110 is used to provide an output related to carbon dioxide emissions of the electric vehicle 12. For example, the output can be an indication of the reduction in carbon dioxide emissions of the electric vehicle 12 in comparison to a standard vehicle with an internal combustion engine. In a related example, the amount of energy regenerated by electric vehicle 12, for example using a regenerative braking technique, can be monitored using test device 14 and an output provided using user I/O 110 which indicates the equivalent amount of carbon dioxide which would have been generated by typical internal combustion engine had the energy not been recovered.

In another example configuration, test device 14 can be used to monitor operation of electric vehicle 12 and collect information related to the efficiency of the electric vehicle 12 under different operating conditions. This information is then used by device 14 to instruct and operator through user I/O 110 to operate the electric vehicle 12 in a manner which increases efficiency. For example, if system A shown in FIG. 4 comprises a regenerative braking system, and system B is the battery pack for the electric vehicle, the test device 14 can monitor the energy recovered by the regenerative braking system and the amount of energy which the battery pack is capable of storing. Thus, if measurements indicate that the battery pack is only capable of accepting a maximum of 50 kW, the device 14 can instruct the operator when braking to attempt to rapidly approach the 50 kW energy recovering level, and maintain the 50 kW recovery level for an extended period without exceeding that level. This will ensure that the maximum amount of energy is recovered during a braking operation. Similar techniques can be used to instruct the operator during acceleration periods, idling periods, "stop and go" traffic, etc. In a more advanced configuration, the device 14 is configured to control operation of the systems in vehicle 12 in a manner which differs from the configuration provided by the control system, for example, implemented in microprocessor 150 of electric vehicle 12. For example, the test device 14 can provide instructions or information on databus 130 which allows the charging system or the regeneration system of electric vehicle 12 to charge the battery pack 20 to a higher or lower level than that set by the internal control system of the vehicle. This may be used, for example, to extend the life of systems within the vehicle, increase the range of the vehicle, test certain systems, or for other functions or purposes.

Although the present invention has been described with reference to preferred embodiments, workers skilled in the art will recognize that changes may be made in form and detail without departing from the spirit and scope of the invention. For example, although storage batteries or a "battery pack" described, as used herein the term electric energy storage device includes a battery or collection of batteries, capacitors including supercapacitors and ultracapacitors, and other storage devices. As used herein, electric vehicle includes any type of vehicle which uses an electric motor to propel, or assist in propelling, the vehicle. One example electric vehicle is a vehicle with an electric motor and an electric storage device such as a battery pack or the like. Another example electric vehicle is an electric vehicle with regenerative techniques in which energy is recovered, for example, from the braking process. Another example electric vehicle is a hybrid vehicle which also includes an internal combustion engine for use in supplementing electric power, and/or charging the electrical energy storage device. Such a hybrid vehicle may optionally include regenerative systems for energy recovery. As used herein, "operating" an electric vehicle includes using the vehicle, or systems of the vehicle, and is not limited to driving the vehicle. In one configuration the test is separate from the vehicle and may be selectively coupled to the vehicle or added after manufacture of the vehicle. The "virtual" Kelvin configuration calculates a parameter of a system of the vehicle using two or more inputs from sensors which are transmitted over a databus of the vehicle.

What is claimed is:

1. A method of testing an electrical system of an electric vehicle, comprising:
    operating the electric vehicle;
    coupling to a databus of the electric vehicle;
    monitoring data on the data bus and retrieving information related to current flowing into the electrical system of the electric vehicle during the step of operating;
    monitoring data on the databus and retrieving information related to a voltage of the electrical system during the step of operating;
    diagnosing the electric vehicle based upon the monitored current and the monitored voltage; and
    wherein diagnosing the electric vehicle includes compensating for a time difference between retrieving information related to current flowing into the system and retrieving information related to a voltage of the system.

2. The method of claim 1 including instructing an operator regarding operation of the electric vehicle.

3. The method of claim 1 wherein diagnosing includes comparing monitored current and monitored voltage or function of the monitored current and monitored voltage with nominal values.

4. The method of claim 1 including wirelessly communicating between the connection to the databus and test circuitry.

5. The method of claim 1 wherein the databus comprises an OBD databus.

6. The method of claim 1 wherein the system comprises a battery pack of the vehicle.

7. The method of claim 6 including monitoring a second system of the vehicle.

8. The method of claim 7 wherein the second system comprises a regenerative braking system.

9. The method of claim 8 wherein diagnosing comprises monitoring energy output from the regenerative braking system and monitoring energy input into the battery pack.

10. The method of claim 9 wherein the diagnosing further comprises determining efficiency of the transfer of energy recovered from the regenerative braking system and stored in the battery pack.

11. The method of claim 1 wherein the system comprises a block of cells of a battery pack of the electric vehicle.

12. The method of claim 11 including monitoring a second block of cells of the battery pack.

13. The method of claim 12 wherein the diagnosing comprises comparing a parameter of the first block of cells with a parameter of the second block of cells.

14. The method of claim 1 wherein the diagnosing comprises measuring a parameter of the system.

15. The method of claim 14 wherein the parameter comprises a dynamic parameter.

16. The method of claim 1 including providing an output to an operator of the electric vehicle.

17. The method of claim 16 wherein the output comprises instructions related to operation of the vehicle for use in performing the step of diagnosing.

18. The method of claim 1 wherein the electric vehicle comprises a hybrid vehicle.

19. The method of claim 18 wherein the system comprises an electric generator coupled to an internal combustion engine of the electric vehicle.

20. The method of claim 19 including monitoring a second system of the electric vehicle, wherein the second system comprises a battery pack and the step of diagnosing comprises determining efficiency of storage of energy from the generator by the battery pack.

21. The method of claim 1 including placing information onto the databus which affects operation of the electric vehicle.

22. The method of claim 1 including placing information onto the databus which affects operation of a system of the electric vehicle.

23. The method of claim 1 including providing an output to an operator of the vehicle to instruct the operator to operate the vehicle in a manner to increase energy efficiency.

24. An apparatus for testing an electric vehicle, comprising:
    a databus connector configured to connect to a databus of the electric vehicle;
    a microprocessor configured to:
        retrieve voltage information from the databus of the electric vehicle provided by a voltage sensor coupled to an electrical system of the electric vehicle;
        retrieve current information from the databus of the electric vehicle provided by a voltage sensor coupled to the electrical system of the electric vehicle;
        diagnose the operation of the vehicle based upon the retrieved current information and the retrieved voltage information; and
        wherein the microprocessor compensates for a time difference between retrieving information related to current flowing into the system and retrieving information related to a voltage of the system.

25. The apparatus of claim 24 wherein the microprocessor compares monitored current and monitored voltage or a function of monitored voltage and monitored current, with nominal values.

26. The apparatus of claim 24 wherein the databus comprises an OBD databus.

27. The apparatus of claim 24 wherein the system comprises a battery pack of the vehicle.

28. The apparatus of claim 24 wherein the microprocessor monitors a second system of the vehicle.

29. The apparatus of claim 28 wherein the second system comprises a regenerative braking system.

30. The apparatus of claim 29 wherein the microprocessor monitors energy output from the regenerative braking system and monitors energy input into the battery pack.

31. The apparatus of claim 30 wherein the microprocessor further determines efficiency of the transfer of energy recovered from the regenerative braking system and stored in the battery pack.

32. The apparatus of claim 24 wherein the system comprises a block of cells of a battery pack of the electric vehicle.

33. The apparatus of claim 32 wherein the microprocessor monitors a second block of cells of the battery pack.

34. The apparatus of claim 33 wherein the microprocessor compares a parameter of the first block of cells with a parameter of the second block of cells.

35. The apparatus of claim 24 wherein the microprocessor measures a parameter of the system.

36. The apparatus of claim 35 wherein the parameter comprises a dynamic parameter.

37. The apparatus of claim 24 including an output provided to an operator of the electric vehicle.

38. The apparatus of claim 37 wherein the output comprises instructions related to operation of the vehicle for use in performing the step of diagnosing.

39. The apparatus of claim 24 wherein the electric vehicle comprises a hybrid vehicle.

40. The apparatus of claim 24 wherein the system comprises an electric generator coupled to an internal combustion engine of the electric vehicle.

41. The apparatus of claim 40 wherein the microprocessor monitors a second system of the electric vehicle, wherein the second system comprises a battery pack and the microprocessor determines efficiency of storage of energy from the generator by the battery pack.

42. The apparatus of claim 24 wherein the microprocessor is configured to place information onto the databus which affects operation of the electric vehicle.

* * * * *